(12) United States Patent
Ji

(10) Patent No.: US 10,680,117 B2
(45) Date of Patent: Jun. 9, 2020

(54) THIN FILM TRANSISTOR, METHOD FOR MANUFACTURING THE SAME AND DISPLAY DEVICE COMPRISING THE SAME

(71) Applicant: LG Display Co., Ltd., Seoul (KR)

(72) Inventor: Kwanghwan Ji, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/199,945

(22) Filed: Nov. 26, 2018

(65) Prior Publication Data
US 2019/0165184 A1 May 30, 2019

(30) Foreign Application Priority Data

Nov. 29, 2017 (KR) .......................... 10-2017-0161153

(51) Int. Cl.
*H01L 29/786* (2006.01)
*H01L 29/66* (2006.01)
(Continued)

(52) U.S. Cl.
CPC ..... *H01L 29/78693* (2013.01); *G09G 3/3648* (2013.01); *H01L 29/42384* (2013.01);
(Continued)

(58) Field of Classification Search
CPC ........... H01L 29/78693; H01L 29/7869; H01L 29/78618
See application file for complete search history.

(56) References Cited

U.S. PATENT DOCUMENTS

2008/0067508 A1 3/2008 Endo et al.
2010/0065910 A1 3/2010 Takeoka
(Continued)

FOREIGN PATENT DOCUMENTS

JP 2007-208079 A 8/2007
JP 2008-72025 A 3/2008
(Continued)

OTHER PUBLICATIONS

Sato et al., Amorphous In—Ga—Zn—O coplanar homojunction thin-film transistor, Applied Physics Letters 94, 133502 (2009) Year: (2009).*

*Primary Examiner* — Cuong Q Nguyen
*Assistant Examiner* — Shih Tsun A Chou
(74) *Attorney, Agent, or Firm* — Birch, Stewart, Kolasch & Birch, LLP

(57) ABSTRACT

A thin film transistor is disclosed, which includes an oxide semiconductor layer on a substrate; a gate insulating film on the oxide semiconductor layer; a gate electrode on the gate insulating film; a hydrogen supply layer on the gate insulating film; a source electrode connected with the oxide semiconductor layer; and a drain electrode spaced apart from the source electrode and connected with the oxide semiconductor layer, wherein the oxide semiconductor layer includes a channel portion overlapped with the gate electrode and a connecting portion not overlapped with the gate electrode, a hydrogen concentration of the connecting portion is higher than that of the channel portion, and the gate insulating film includes a first area overlapped with the gate electrode and a second area not overlapped with the gate electrode, and a hydrogen concentration of the second area is higher that of the first area.

10 Claims, 10 Drawing Sheets

(51) Int. Cl.
  *G09G 3/36* (2006.01)
  *H01L 29/49* (2006.01)
  *H01L 29/51* (2006.01)
  *H01L 29/423* (2006.01)

(52) U.S. Cl.
  CPC .......... *H01L 29/4908* (2013.01); *H01L 29/51* (2013.01); *H01L 29/66969* (2013.01); *H01L 29/7869* (2013.01); *H01L 29/78618* (2013.01); *H01L 29/78633* (2013.01)

(56) References Cited

U.S. PATENT DOCUMENTS

| | | | |
|---|---|---|---|
| 2012/0161125 A1* | 6/2012 | Yamazaki | ........... H01L 29/7869 257/43 |
| 2015/0263141 A1 | 9/2015 | Yamazaki et al. | |
| 2016/0284562 A1 | 9/2016 | Jeong et al. | |
| 2016/0284572 A1 | 9/2016 | Jeong et al. | |
| 2016/0284823 A1 | 9/2016 | Yamazaki | |
| 2017/0176826 A1* | 6/2017 | Tsuda | .................... H01L 27/127 |

FOREIGN PATENT DOCUMENTS

| | | |
|---|---|---|
| JP | 2010-278393 A | 12/2010 |
| JP | 2015-186079 A | 10/2015 |
| JP | 2016-189456 A | 11/2016 |
| JP | 2017-116622 A | 6/2017 |
| KR | 10-2012-0090000 A | 8/2012 |
| KR | 10-2016-0114511 A | 10/2016 |
| KR | 2016-189454 A | 11/2016 |
| WO | WO 2009/128186 A1 | 10/2009 |

\* cited by examiner

THIN FILM TRANSISTOR, METHOD FOR MANUFACTURING THE SAME AND DISPLAY DEVICE COMPRISING THE SAME

CROSS-REFERENCE TO RELATED APPLICATION

This application claims the priority benefit of Korean Patent Application No. 10-2017-0161153, filed in the Republic of Korea on Nov. 29, 2017, which is hereby incorporated by reference in its entirety as if fully set forth herein.

BACKGROUND OF THE INVENTION

Field of the Invention

The present disclosure relates to a thin film transistor, a method for manufacturing the same and a display device including the same.

Description of the Related Art

A transistor has been widely used in the field of electronic devices as a switching device or a driving device. Particularly, since a thin film transistor can be manufactured on a glass substrate or a plastic substrate, it has been widely used as a switching device of a display device such as a liquid crystal display device or an organic light emitting device.

Based on a material constituting an active layer, a thin film transistor may be categorized into an amorphous silicon thin film transistor in which an amorphous silicon is used as an active layer, a polycrystalline silicon thin film transistor in which a polycrystalline silicon is used as an active layer, and an oxide semiconductor thin film transistor in which an oxide semiconductor is used as an active layer.

Since an amorphous silicon may be deposited in a short time to form an active layer, the amorphous silicon thin film transistor (a-Si TFT) has advantages in that its manufacturing process time is short and production costs are low. However, the amorphous silicon thin film transistor has a disadvantage in that it may not be used in an active matrix organic light emitting device (AMOLED) because its current driving capability is not good due to low mobility and changes in a threshold voltage that occur.

A polycrystalline silicon thin film transistor (poly-Si TFT) is manufactured by depositing and crystallizing an amorphous silicon. Since a process of crystallizing an amorphous silicon is required during a manufacturing process of a polycrystalline silicon thin film transistor, the number of process steps increases to cause increase of manufacturing costs, and the crystallizing process is performed at a high process temperature, it is difficult to apply the polycrystalline silicon thin film transistor to a device with a large area. Also, it is difficult to secure uniformity of the polycrystalline silicon thin film transistor due to polycrystalline properties.

For the oxide semiconductor thin film transistor (oxide semiconductor TFT), an oxide constituting the active layer may be deposited at a relatively low temperature, the mobility of the oxide semiconductor thin-film transistor is high, and a change in the resistance of the oxide is great depending on the content of oxygen, whereby desired physical properties of the oxide semiconductor thin film transistor can easily be obtained. In addition, since the oxide semiconductor is transparent due to the properties of the oxide, the oxide semiconductor thin film transistor is advantageous in the realization of a transparent display. However, in order to apply an oxide semiconductor layer to a thin film transistor, a separate process of conductorization (i.e. providing conductivity) of the oxide semiconductor layer is required to form a connecting portion for a source electrode and a drain electrode.

SUMMARY OF THE INVENTION

The present disclosure has been made in view of the above problems, and it is an object of the present disclosure to provide a thin film transistor including a hydrogen supply layer disposed on a gate insulating film and an oxide semiconductor layer having a connecting portion which is conductorized (i.e. provided with conductivity) by hydrogen.

It is another object of the present disclosure to provide a thin film transistor including a connecting portion formed by a hydrogen treatment and an ultraviolet treatment.

It is still another object of the present disclosure to provide a thin film transistor including a gate insulating film covering an entire surface of an oxide semiconductor layer to prevent the oxide semiconductor layer from being damaged and a method for manufacturing the same.

It is further still another object of the present disclosure to provide a method for manufacturing a thin film transistor, in which a connecting portion may be conductorized in a short time by an ultraviolet treatment in addition to a hydrogen treatment.

It is further still another object of the present disclosure to provide a display device including a thin film transistor described as above.

In accordance with an aspect of one embodiment of the present disclosure, the above and other objects can be accomplished by the provision of a thin film transistor including an oxide semiconductor layer on a substrate; a gate insulating film on the oxide semiconductor layer; a gate electrode on the gate insulating film; a hydrogen supply layer on the gate insulating film; a source electrode connected with the oxide semiconductor layer; and a drain electrode spaced apart from the source electrode and connected with the oxide semiconductor layer, wherein the oxide semiconductor layer includes a channel portion overlapped with the gate electrode and a connecting portion not overlapped with the gate electrode, a hydrogen concentration of the connecting portion is higher than that of the channel portion, and the gate insulating film includes a first area overlapped with the gate electrode and a second area not overlapped with the gate electrode, and a hydrogen concentration of the second area is higher that of the first area.

The connecting portion has a gradient of a hydrogen concentration along a direction toward the hydrogen supply layer from the substrate.

The connecting portion has a hydrogen concentration of approximately 3 atom % to approximately 6 atom %.

The gate insulating film is disposed on an entire surface of the oxide semiconductor layer in an opposite direction of the substrate.

The second area of the gate insulating film has a gradient of a hydrogen concentration along a thickness direction.

A hydrogen concentration of the second area increases in a direction toward the hydrogen supply layer from the substrate.

The hydrogen supply layer is extended to an upper portion of the gate electrode.

For the hydrogen supply layer, a hydrogen concentration of the area overlapped with the gate electrode is higher than that of the area not overlapped with the gate electrode.

The hydrogen supply layer has a thickness of approximately 2 nm to approximately 10 nm.

In accordance with another aspect of the present disclosure, there is provided a method for manufacturing a thin film transistor, including forming an oxide semiconductor layer on a substrate; forming a gate insulating film on the oxide semiconductor layer; forming a gate electrode on the gate insulating film to partially overlap the oxide semiconductor layer; forming a hydrogen supply layer on the gate insulating film; irradiating ultraviolet rays to the hydrogen supply layer; and forming a source electrode and a drain electrode spaced apart from each other and respectively connected with the oxide semiconductor layer.

The gate insulating film is formed on an entire surface of the oxide semiconductor layer.

The hydrogen supply layer is formed to be extended to an upper portion of the gate electrode.

The hydrogen supply layer is formed of a silicon nitride.

A wavelength of the ultraviolet rays ranges from approximately 150 nm to approximately 300 nm.

In accordance with still another aspect of the present disclosure, there is provided a display device including a substrate; a thin film transistor disposed on the substrate; and a first electrode connected with the thin film transistor, wherein the thin film transistor includes: an oxide semiconductor layer on the substrate; a gate insulating film on the oxide semiconductor layer; a gate electrode on the gate insulating film; a hydrogen supply layer on the gate insulating film; a source electrode connected with the oxide semiconductor layer; and a drain electrode spaced apart from the source electrode and connected with the oxide semiconductor layer, and wherein the oxide semiconductor layer includes a channel portion overlapped with the gate electrode and a connecting portion not overlapped with the gate electrode, a hydrogen concentration of the connecting portion is higher than that of the channel portion, the gate insulating film includes a first area overlapped with the gate electrode and a second area not overlapped with the gate electrode, and a hydrogen concentration of the second area is higher than that of the first area.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
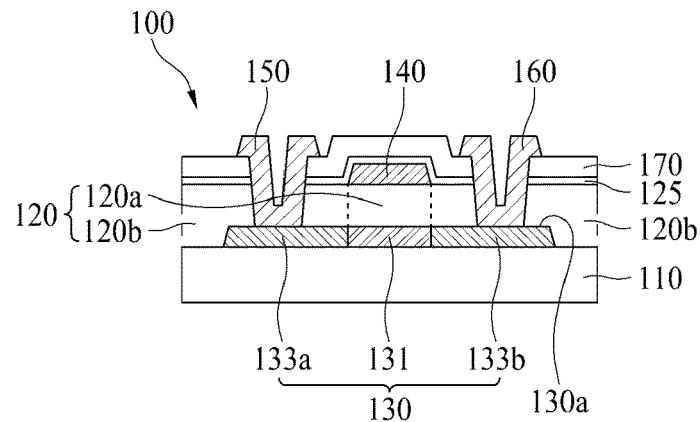
FIG. 1 is a cross-sectional view illustrating a thin film transistor according to one embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the instance in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," and "next," the instance of no contact therebetween may be included, unless "just" or "direct" is used. If it is mentioned that a first element is positioned "on" a second element, it does not mean that the first element is essentially positioned above the second element in the figure.

The upper part and the lower part of an object concerned may be changed depending on the orientation of the object. Consequently, the instance in which a first element is positioned "on" a second element includes the instance in which the first element is positioned "below" the second element as well as the instance in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship. In the present disclosure, the term "conductorize" means "make a part of a layer (i.e. semiconductor layer) conductive, and the term "conductorization" means "making a part of a layer (i.e. semiconductor layer) conductive.

Hereinafter, the example embodiments of a thin film transistor, a method for manufacturing the same and a display device including the same according to one embodiment of the present disclosure will be described in detail with reference to the accompanying drawings. Wherever possible, the same reference numbers will be used throughout the drawings to refer to the same or like parts.

FIG. 1 is a cross-sectional view illustrating a thin film transistor 100 according to one embodiment of the present disclosure.

Referring to FIG. 1, the thin film transistor 100 according to one embodiment of the present disclosure includes an oxide semiconductor layer 130 on a substrate 110, a gate insulating film 120 on the oxide semiconductor layer 130, a gate electrode 140 on the gate insulating film 120, a hydrogen supply layer 125 on the gate insulating film 120, a source electrode 150 connected with the oxide semiconductor 130, and a drain electrode 160 spaced apart from the source electrode 150 and connected with the oxide semiconductor layer 130. All the components of the thin film transistor 100 according to all embodiments of the present disclosure are operatively coupled and configured.

Glass or plastic can be used as the substrate 110. A transparent plastic which has a flexible property, for example, polyimide can be used as the plastic.

A buffer layer can be disposed on the substrate 110. The buffer layer can include at least one of a silicon oxide and a silicon nitride. The buffer layer protects the oxide semiconductor layer 130, and can planarize an upper portion of the substrate 110.

The oxide semiconductor layer 130 can be disposed on the substrate 110. The oxide semiconductor layer 130 includes an oxide semiconductor material. For example, the oxide semiconductor layer 130 can include at least one of IZO (InZnO)-, IGO (InGaO)-, ITO (InSnO)-, IGZO (InGaZnO)-, IGZTO (InGaZnSnO), GZTO (GaZnSnO)-, GZO (GaZnO)-, and ITZO (InSnZnO)-based oxide semiconductor materials. However, one embodiment of the present disclosure is not limited to this example, and the oxide semiconductor layer 130 can be made of other oxide semiconductor material.

The oxide semiconductor layer 130 includes a channel portion 131 overlapped with the gate electrode 140 and connecting portions 133a and 133b that are not overlapped with the gate electrode 140. At the connecting portions 133a and 133b, the oxide semiconductor layer 130 can be connected with the source electrode 150 and the drain electrode 160. The connecting portions 133a and 133b include a first connecting portion 133a that can be connected with the source electrode 150 and a second connecting portion 133b that can be connected with the drain electrode 160.

The channel portion 131 of the oxide semiconductor layer 130 can be an area overlapped with the gate electrode 140 and a channel can be formed on the channel portion 131.

The connecting portions 133a and 133b can be formed by a selective conductorization of the oxide semiconductor layer 130 on an area that need not be overlapped with the gate electrode 140. For a conductorization, hydrogen treatment and ultraviolet treatment are performed. For example, in a state that the channel portion 131 can be masked, the connecting portions 133a and 133b can be formed by performing hydrogen treatment and ultraviolet irradiation on areas other than the channel portion 131. Referring to FIG. 1, the gate electrode 140 serves as a mask. According to one embodiment of the present disclosure, hydrogen concentration of the connecting portions 133a and 133b can be higher than that of the channel portion 131.

The connecting portions 133a and 133b that have a relatively high hydrogen concentration compared with the channel portion 131 can have a superior conductivity and a high mobility. Therefore, through the connecting portions 133a and 133b, the oxide semiconductor layer 130 can have an excellent electric contact with the source electrode 150 and the drain electrode 160. These connecting portions 133a and 133b can be also called "conductorized portions". In detail, a conductivity of the connecting portions 133a and 133b is higher than that of the channel portion 131, because the connecting portions 133a and 133b have a higher hydrogen concentration than that of the channel portion 131.

According to one embodiment of the present disclosure, hydrogen can be supplied to the connecting portions 133a and 133b by the hydrogen supply layer 125. Referring to FIG. 1, since hydrogen can be supplied from the hydrogen supply layer 125 to the connecting portions 133a and 133b, the hydrogen concentration in the hydrogen supply layer 125 can be higher than the hydrogen concentration in the substrate 110. For example, the connecting portions 133a and 133b have a gradient of the hydrogen concentration along a thickness direction. In more detail, the connecting portions 133a and 133b have a gradient of the hydrogen concentration along a direction (thickness direction) toward the hydrogen supply layer 125 from the substrate 110.

The connecting portions 133a and 133b have a hydrogen concentration of 3 to 6 atoms %. If the hydrogen concentration of the connecting portions 133a and 133b can be less than 3 atoms %, conductivity of the connecting portions 133a and 133b can be deteriorated, whereby electric property between the oxide semiconductor layer 130 and the source electrode 150 or the drain electrode 160 can be deteriorated. On the other hand, if the hydrogen concentration of the connecting portions 133a and 133b exceeds 6 atoms %, electric stability of the connecting portions 133a and 133b can be deteriorated due to an excessive hydrogen content and hydrogen included in the connecting portions 133a and 133b can be permeated into the channel portion 131, whereby the channel portion 131 can become conductorized.

The connecting portions 133a and 133b can have the hydrogen concentration of 10 times to 1,000 times as compared with the channel portion 131 based on the number of atoms. Due to such a difference of the hydrogen concentration, the connecting portions 133a and 133b can have electric conductivity more excellent than that of the channel portion 131. According to one embodiment of the present disclosure, the conductivity of the connecting portions 133a and 133b is higher than that of the channel portion 131 based on that the connecting portions 133a and 133b having a higher hydrogen concentration than that of the channel portion 131.

The gate insulating film 120 can be disposed on the oxide semiconductor layer 130. The gate insulating film 120 can include at least one of a silicone oxide and silicon nitride. The gate insulating film 120 can have a single layer structure and a multi-layer structure.

According to one embodiment of the present disclosure, the gate insulating film 120 can be disposed on the entire surface of the oxide semiconductor layer 130 in an opposite direction of the substrate 110. Hereinafter, a surface of the oxide semiconductor layer 130 in an opposite direction of the substrate 110 can be referred to as a first surface 130a of the oxide semiconductor layer 130.

Referring to FIG. 1, the gate insulating film 120 can be disposed on the entire surface of the substrate 110 including the oxide semiconductor layer 130. As a result, the first surface 130a of the oxide semiconductor layer 130 can fully be covered by the gate insulating film 120. In the instance that the gate insulating film 120 fully covers the first surface 130a of the oxide semiconductor layer 130, defects of insulation between the gate electrode 140 and the oxide semiconductor layer 130 can be avoided.

For example, in the instance that the gate insulating film 120 can be patterned like the gate electrode 140, due to a residue of a material for forming the gate electrode 140 or other impurities, a leakage current can occur between the gate electrode 140 and the oxide semiconductor layer 130, or a short can occur between the gate electrode 140 and the oxide semiconductor layer 130.

According to one embodiment of the present disclosure, since the gate insulating film 120 fully covers the first surface 130a of the oxide semiconductor layer 130, a leakage current or a short between the gate electrode 140 and the oxide semiconductor layer 130 can be prevented from occurring, whereby reliability of the thin film transistor 100 can be ensured. Particularly, even if a thickness of the gate electrode 120 gets thin, a leakage current or a short between the gate electrode 140 and the oxide semiconductor layer 130 does not occur, whereby a thin-film of a thin film transistor can be performed and a switching property can be improved.

The gate insulating film 120 includes a first area 120a overlapped with the gate electrode 140 and a second area 120b not overlapped with the gate electrode 140. According to one embodiment of the present disclosure, a hydrogen concentration of the second area 120b can be higher than that of the first area 120a.

Referring to FIG. 1, hydrogen can be supplied to the gate insulating film 120 in the process of supplying hydrogen from the hydrogen supply layer 125 above the connecting portions 133a and 133b to the connecting portions 133a and 133b. In this instance, since the first area 120a can be masked from the hydrogen supply layer 125 by the gate electrode 140, the first area 120a contains hydrogen with lower concentration than that of the second area 120b. Regarding the second area 120b, a hydrogen concentration in the hydrogen supply layer 125 can be higher than a hydrogen concentration in the substrate 110. For example, the second area 120b of the gate insulating film 120 has a gradient of a hydrogen concentration along a thickness direction. In more detail, the hydrogen concentration of the second area 120b can increase along a direction (thickness direction) toward the hydrogen supply layer 125 from the substrate 110.

The gate electrode 140 can be disposed on the gate insulating film 120. Specifically, the gate electrode 140 can be insulated from the oxide semiconductor layer 130 and overlapped with at least a part of the oxide semiconductor layer 130. More specifically, the gate electrode 140 can be overlapped with the channel portion 131 of the oxide semiconductor layer 130 and the first area 120a of the gate insulating film 120. Meanwhile, as shown in FIG. 1, a structure of the thin film transistor 100 in which the gate electrode 140 can be disposed on the oxide semiconductor layer 130 can be referred to as a top gate structure.

The gate electrode 140 can include at least one of aluminum based metal such as aluminum (A1) or an aluminum alloy, silver based metal such as silver (Ag) or a silver alloy, copper (Cu) based metal such as Cu or a Cu alloy, molybdenum (Mo) based metal such as Mo or an Mo alloy, and chrome (Cr), tantalum (Ta), neodymium (Nd), and titanium (Ti) or an alloy thereof. The gate electrode 140 can have a structure of a multi-layered film including at least two conductive films having their respective physical properties different from each other.

The hydrogen supply layer 125 can be disposed on the gate insulating film 120. According to one embodiment of the present disclosure, the hydrogen supply layer 125 can be extended to the upper portion of the gate electrode 140. After the gate electrode 140 can be formed on the gate insulating film 120, the hydrogen supply layer 125 can be formed on the entire surface including the gate insulating film 120 and the gate electrode 140. In this instance, the hydrogen supply layer 125 can easily be formed without a separate patterning process or use of a mask. The hydrogen supply layer 125 can be disposed in contact with the gate insulating film 120.

Referring to FIG. 1, the hydrogen supply layer 125 can be formed on the gate insulating film 120 and the gate electrode 140 in a single body. In more detail, the hydrogen supply layer 125 can be disposed on the second area 120b of the gate insulating film 120 and the gate electrode 140 and connected with them. The gate electrode 140 can be disposed between the first area 120a of the gate insulating film 120 and the hydrogen supply layer 125 and serves as a shielding film or a mask.

The hydrogen supply layer 125 contains hydrogen more than that of the gate insulating film 120. The hydrogen supply layer 125, for example, can be a film made of a silicon nitride. The silicon nitride can be expressed as $SiN_x$ in general and contain more amount of hydrogen. For example, the silicon nitride contains hydrogen with higher concentration, as compared with a silicon oxide. Therefore, according to one embodiment of the present disclosure, the hydrogen supply layer 125 can be formed using a silicon nitride which contains more amount of hydrogen while having an insulation property. However, one embodiment of the present disclosure is not limited to this instance, and the hydrogen supply layer 125 can be formed of other materials containing hydrogen while having an insulation property.

The hydrogen supply layer 125 supplies hydrogen to the oxide semiconductor layer 130 through the gate insulating film 120. In more detail, the hydrogen supply layer 125 supplies hydrogen to the connecting portions 133a and 133b of the oxide semiconductor layer 130 though the second area 120b of the gate insulating film 120. In this instance, if a thickness of the hydrogen supply layer 125 can be less than 2 nm, the amount of hydrogen supplied from the hydrogen supply layer 125 is not enough to allow the connecting portions 133a and 133b to be sufficiently conductorized. On the other hand, if a thickness of the hydrogen supply layer 125 exceeds 10 nm, too much hydrogen can be supplied from the hydrogen supply layer 125, whereby not only the connecting portions 133a, 133b but also the channel portion 131 can become conductorized. Therefore, the hydrogen supply layer 125 according to one embodiment of the present disclosure has a thickness ranging from 2 nm to 10 nm. By adjusting a thickness of the hydrogen supply layer to 2 nm to 10 nm, hydrogen can selectively be supplied to the connecting portions 133a and 133b of the oxide semiconductor layer 130.

Referring to FIG. 1, the gate electrode 140 serves as a mask for blocking a mobility of hydrogen in the hydrogen supply layer 125. Therefore, in the area overlapped with the gate electrode 140, the amount of hydrogen moving to the first area 120a of the gate insulating film 120 located on the lower portion can be very little. Therefore, according to one embodiment of the present disclosure, in the hydrogen supply layer 125, the hydrogen concentration in the area overlapped with the gate electrode 140 can be higher than the hydrogen concentration in the area not overlapped with the gate electrode.

An inter-layer dielectric film 170 can be disposed on the gate electrode 140. The inter-layer dielectric film 170 can be made of an insulating material. In detail, the inter-layer dielectric film 170 can be made of an organic material, an inorganic material, or a deposited layer of an organic layer and an inorganic layer.

The source electrode 150 and the drain electrode 160 can be disposed on the inter-layer dielectric film 170. Each of the source electrode 150 and the drain electrode 160 can be connected with the oxide semiconductor layer 130 while they can be spaced apart from each other. Each of the source electrode 150 and the drain electrode 160 can be connected with the oxide semiconductor layer 130 though a contact hole formed on the gate insulating film 120, the hydrogen supply layer 125, and the inter-layer dielectric film 170.

The source electrode 150 and the drain electrode 160 can include at least one of Mo, Al, Cr, Au, Ti, Ni, Nd, Cu and their alloy. Each of the source electrode 150 and the drain electrode 160 can be formed of a single layer made of a metal or a metal alloy, or can be formed of a multi-layer with more than two layers.

Figure 2:
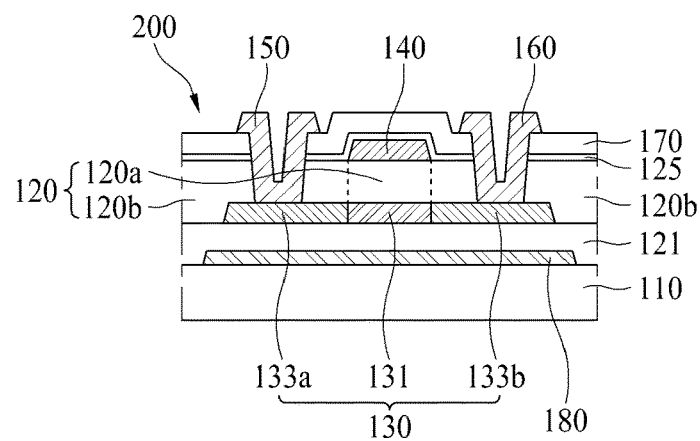
FIG. 2 is a cross-sectional view illustrating a thin film transistor according to another embodiment of the present disclosure.

FIG. 2 is a cross-sectional view illustrating a thin film transistor 200 according to another embodiment of the present disclosure. Hereinafter, description of the elements that have been already described above will be omitted to avoid repetition of description.

The thin film transistor 200 in FIG. 2 further includes a light-shielding layer 180 on the substrate 110 and a buffer layer 121 on the light-shielding layer 180 as compared with the thin film transistor in FIG. 1.

The light-shielding layer 180 can be overlapped with the oxide semiconductor layer 130. The light-shielding layer 180 shields incident light, which externally enters the oxide semiconductor layer 130, to prevent the oxide semiconductor layer 130 from being damaged due to external incident light. The light-shielding layer 180 can be made of an electric conductive material such as a metal.

The buffer layer 121 can be disposed on the light-shielding layer 180. The buffer layer 121 can include at least one of a silicon oxide and a silicon nitride. The buffer layer 121 can be formed of a single film, or can be formed of a deposited structure in which two or more films can be deposited. The buffer layer 121 has excellent insulation property and planarization property, and can protect the oxide semiconductor layer 130.

Figure 3:
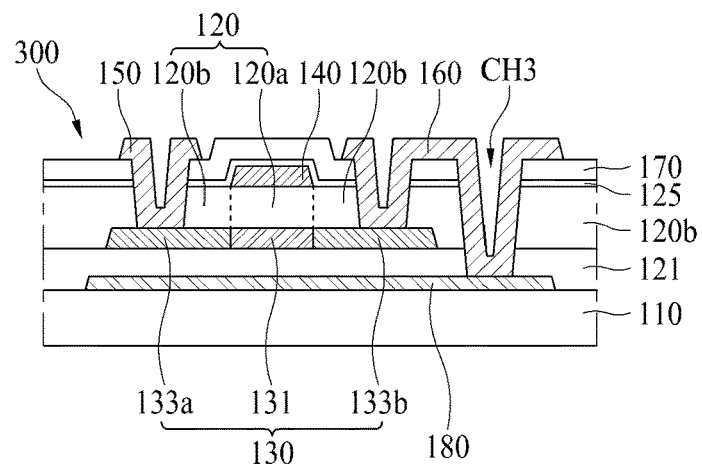
FIG. 3 is a cross-sectional view illustrating a thin film transistor according to other embodiment of the present disclosure.

FIG. 3 is a cross-sectional view illustrating a thin film transistor 300 according to other embodiment of the present disclosure.

In the thin film transistor 300 of FIG. 3, the drain electrode 160 can be connected with the light-shielding layer 180 as well as the oxide semiconductor layer 130 as compared with the thin film transistor 200 of FIG. 2. The light-shielding layer 180 has conductivity. For stable driving of the thin film transistor 300, the drain electrode 160 can be connected with the oxide semiconductor layer 130.

Referring to FIG. 3, the drain electrode 160 can be connected with the light-shielding layer 180 though a contact hole CH3 formed in the buffer layer 121, the gate insulating film 120, the hydrogen supply layer 125, and the inter-layer dielectric film 170.

Hereinafter, a method for manufacturing a thin film transistor 200 will be described with reference to FIGS. 4A to 4J. FIGS. 4A to 4J are views illustrating a manufacturing process of a thin film transistor according to another embodiment of the present disclosure.

Figure 4A:
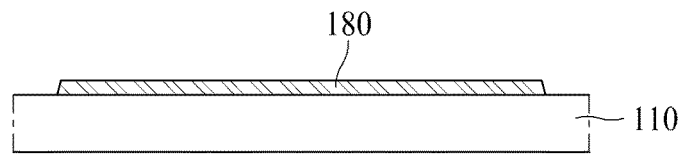
FIGS. 4A to 4J are views illustrating a manufacturing process of a thin film transistor according to another embodiment of the present disclosure.

Referring to FIG. 4A, the light-shielding layer 180 can be formed on the substrate 110.

A glass can be used as the substrate 110, and a plastic that can be bent or curved can be used as well. An example of a plastic that can be used as the substrate 110 includes a polyimide. When a polyimide can be used as the substrate 110, a heat resistant polyimide that can tolerate at a high temperature can be used considering a high heat process can be performed on the substrate 110.

When a plastic can be used as the substrate 110, processes of deposition, etching, etc. can be performed in a state that the plastic substrate can be disposed on a carrier substrate made of a high durable material such as a glass.

The light-shielding layer 180 prevents the oxide semiconductor layer 130 from being damaged due to incident light from the outside.

Figure 4B:
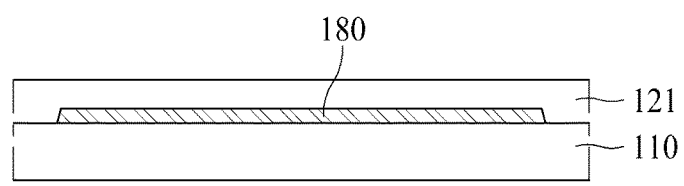

Referring to FIG. 4B, the buffer layer 121 can be formed on the substrate 110 including the light-shielding layer 180. The buffer layer 121 can be formed of a silicon oxide or a silicon nitride. The buffer layer 121 can have a single layered structure or a multi-layered structure.

Figure 4C:
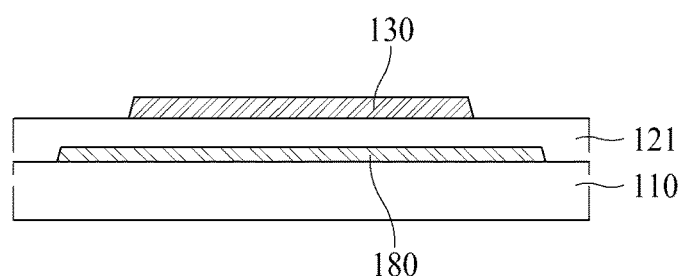

Referring to FIG. 4C, the oxide semiconductor layer 130 can be formed on the substrate 110. In more detail, the oxide semiconductor layer 130 can be formed on the buffer layer 121 on the substrate 110. The oxide semiconductor layer 130 can be made of an oxide semiconductor material. For example, the oxide semiconductor layer 130 can include at least one of IZO (InZnO)-, IGO (InGaO)-, ITO (InSnO)-, IGZO (InGaZnO)-, IGZTO (InGaZnSnO), GZTO (GaZnSnO)-, GZO (GaZnO)-, and ITZO (InSnZnO)-based oxide semiconductor materials. The oxide semiconductor layer 130 can be formed by a deposition or a sputtering.

Figure 4D:
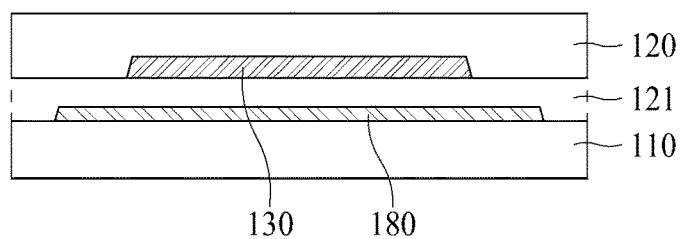

Referring to FIG. 4D, the gate insulating film 120 can be formed on the oxide semiconductor layer 130. The gate insulating film 120 can be formed on the entire surface of the oxide semiconductor layer 130. Referring to FIG. 4D, since the gate insulating film 120 fully covers the surface of the oxide semiconductor layer 130, a risk of occurrence of a leakage current or short between the gate electrode 140 and the oxide semiconductor layer 130 can be avoided, whereby reliability of the thin film transistor 100 can be ensured. Therefore, even if the gate electrode 120 has a thin thickness, a leakage current or short between the gate electrode 140 and the oxide semiconductor layer 130 can be prevented from occurring.

Figure 4E:
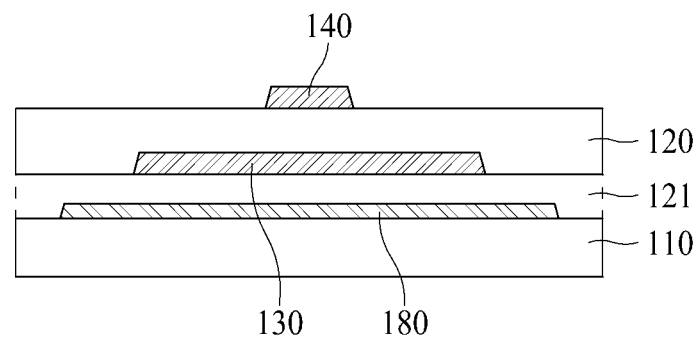

Referring to FIG. 4E, the gate electrode 140 can be formed on the gate insulating film 120. The gate electrode 140 can be insulated from the oxide semiconductor layer 130 and can be overlapped with at least a part of the oxide semiconductor layer 130.

Figure 4F:
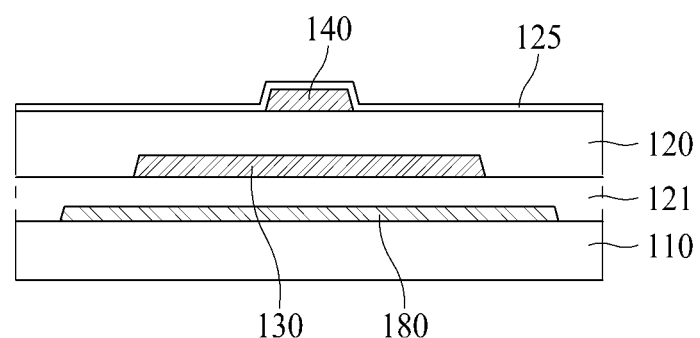

Referring to FIG. 4F, the hydrogen supply layer 125 can be formed on the gate insulating film 120. According to one embodiment of the present disclosure, the hydrogen supply layer 125 can be formed to be extended to the upper portion of the gate electrode 140. The hydrogen supply layer 125 can be formed on the gate insulating film 120 and the gate electrode 140 in a single body. The hydrogen supply layer 125 can be formed in contact with the gate insulating film 120.

The hydrogen supply layer 125 can be formed of a silicon nitride. The hydrogen supply layer 125 can be formed in such a manner that a silicon nitride can be deposited on the entire surfaces of the gate insulating film 120 and the gate electrode 140. Methods such as deposition, sputtering, and coating can be applied to form the hydrogen supply layer 125. In this instance, since a separate patterning process or a mask need not used, the processing cost is not increased due to the hydrogen supply layer 125.

The hydrogen supply layer 125 contains hydrogen more than that of the gate insulating film 120. A silicon nitride used to form the hydrogen supply layer 125 can be expressed as SiNx in general and contains hydrogen more than that of a silicon oxide. Therefore, the hydrogen supply layer 125 can supply hydrogen to the connecting portions 133a and 133b of the oxide semiconductor layer 130. Also, a silicon nitride has an electric insulation property. However, one embodiment of the present disclosure is not limited to this example, and the hydrogen supply layer 125 can be formed of another material containing hydrogen while having an insulation property.

The hydrogen supply layer 125 supplies hydrogen to the oxide semiconductor layer 130 through the gate insulating film 120. In this instance, the gate electrode 140 can be disposed between the gate insulating film 120 and the hydrogen supply layer 125 and serves as a shielding film or a mask to prevent hydrogen generated in the hydrogen supply layer 125 from being injected into the channel portion of the oxide semiconductor layer 130.

In more detail, hydrogen in the hydrogen supply layer 125 moves to the oxide semiconductor layer 130 through an area not overlapped with the gate electrode 140. In more detail, hydrogen moves through an area on the gate insulating film 120 not overlapped with the gate electrode 140. As a result, the second area 120b containing hydrogen more than that of the first area 120a overlapped with the gate electrode 140 can be formed.

As described above, hydrogen in the hydrogen supply layer 125 moves to the oxide semiconductor layer 130 through the second area 120b of the gate insulating film 120. The oxide semiconductor layer 130 partially conductorized by hydrogen supplied from the hydrogen supply layer 125, whereby the connecting portions 133a and 133b can be formed.

If a thickness of the hydrogen supply layer 125 can be less than 2 nm, the amount of hydrogen supplied from the hydrogen supply layer 125 may not be enough to allow the connecting portions 133a and 133b to be sufficiently conductorized. On the other hand, if a thickness of the hydrogen supply layer 125 exceeds 10 nm, too much hydrogen can be supplied from the hydrogen supply layer 125, whereby not only the connecting portions 133a, 133b but also the channel portion 131 can be conductorized. Therefore, the hydrogen supply layer 125 according to one embodiment of the present disclosure has a thickness ranging from 2 nm to 10 nm.

Figure 4G:
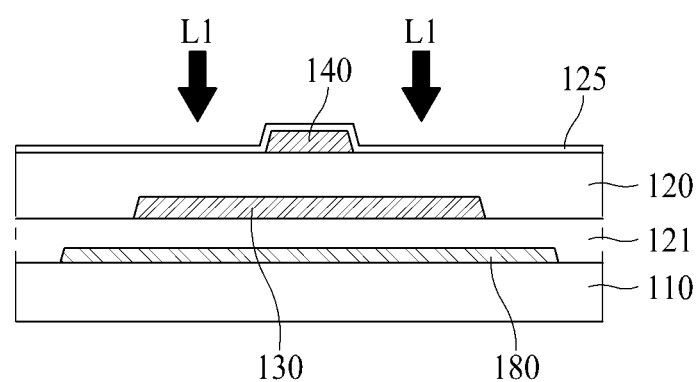

Referring to FIG. 4G, ultraviolet rays L1 can be irradiated to the hydrogen supply layer 125. In this instance, the gate electrode 140 serves to shield ultraviolet rays. As a result, ultraviolet rays can be irradiated only to the connecting portions 133a and 133b of the oxide semiconductor layer 130. Oxygen vacancy can occur at the connecting portions 133a and 133b due to ultraviolet irradiation.

According to one embodiment of the present disclosure, the connecting portions 133a and 133b can be conductorized not only by hydrogen provided by the hydrogen supply layer 125 but also by oxygen vacancy due to ultraviolet irradiation. As such, since the connecting portions 133a and 133b can be conductorized not only by hydrogen but also by ultraviolet irradiation, the time of conductorization of the connecting portions 133a and 133b can be reduced.

The ultraviolet rays L1 can have a wavelength ranging from 150 nm to 300 nm, for example. If the wavelength of the ultraviolet rays is less than 150 nm, other reaction in addition to oxygen vacancy can be caused due to enormously big ultraviolet energy, whereby stability of the oxide semiconductor layer 130 can be deteriorated. On the other hand, if the wavelength of ultraviolet rays exceeds 300 nm, time for irradiation of the ultraviolet rays L1 can be increased due to a low ultraviolet energy.

According to one embodiment of the present disclosure, the ultraviolet rays L1 can be irradiated for 30 minutes to 1 hour. If time for irradiation of the ultraviolet rays L1 is less than 30 minutes, oxygen vacancy does not occur enough to allow the connecting portions 133a and 133b to be sufficiently conductorized. On the other hand, even if time for irradiation of the ultraviolet rays L1 exceeds one hour, since the conductorization of the connecting portions 133a and 133b is not performed any more than the instance that ultraviolet rays are irradiated for one hour, there is no need to increase time for irradiation of the ultraviolet rays unnecessarily.

Figure 4H:
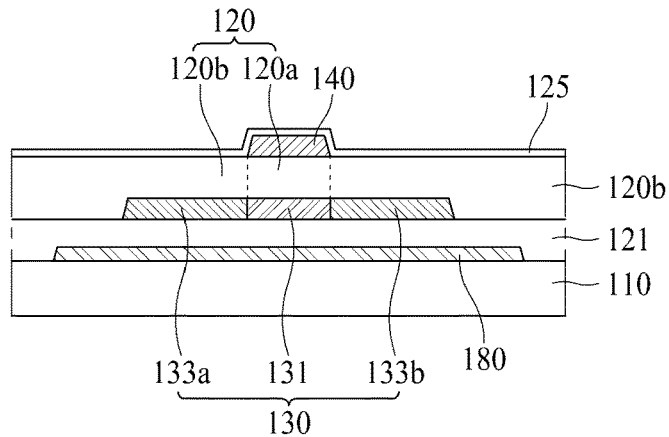

Referring to FIG. 4H, the connecting portions 133a and 133b can be formed by a selective conductorization of the oxide semiconductor layer 130 by the hydrogen supply from the hydrogen supply layer 125 and ultraviolet irradiation, and as a result, the oxide semiconductor layer 130 including the channel portion 131 and the connecting portions 133a and 133b can be formed.

Figure 4I:
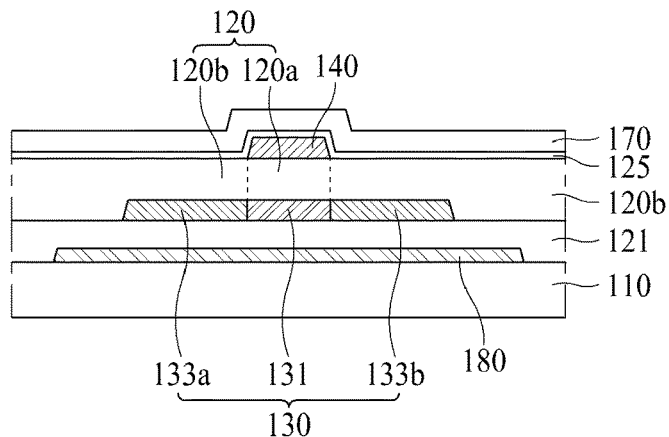

Referring to FIG. 4I, the inter-layer dielectric film 170 can be formed on the gate electrode 140. The inter-layer dielectric film 170 can be formed of an organic material, an inorganic material, or a deposited layer of an organic layer and an inorganic layer.

Figure 4J:
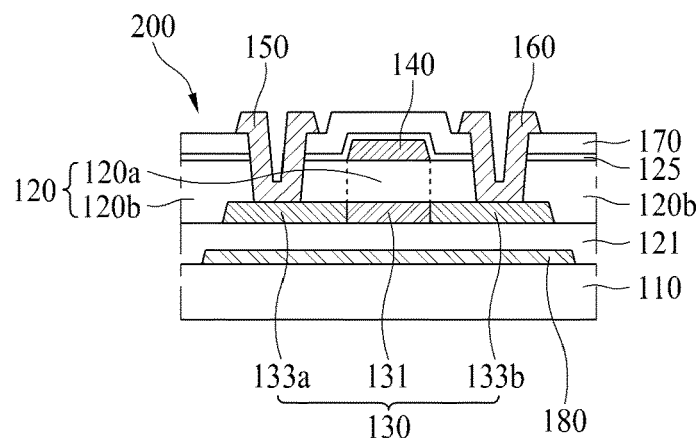

Referring to FIG. 4J, the source electrode 150 and the drain electrode 160 can be formed on the inter-layer dielectric film 170. Each of the source electrode 150 and the drain electrode 160 can be connected with the oxide semiconductor layer 130 while they can be spaced apart from each other.

In more detail, after the inter-layer dielectric film 170, the hydrogen supply layer 125, and the gate insulating film 120 can be partially etched to form at least two contact holes for partially exposing the oxide semiconductor layer 130, each of the source electrode 150 and the drain electrode 160 can be formed, whereby each of the source electrode 150 and the drain electrode 160 can be connected with the oxide semiconductor layer 130.

The source electrode 150 can be connected with the oxide semiconductor layer 130 at the first connecting portion 133a and the drain electrode 160 can be connected with the oxide semiconductor layer 130 at the second connecting portion 133b. As a result, the thin film transistor 200 can be made as shown in FIG. 4J.

Figure 5:
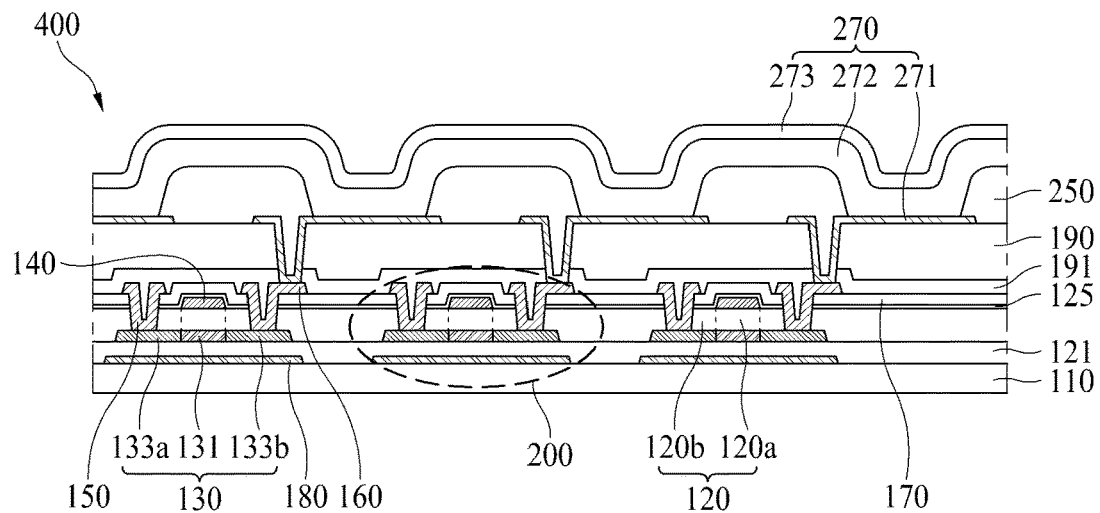
FIG. 5 is a schematic cross-sectional view illustrating a display device according to still another embodiment of the present disclosure.

FIG. 5 is a schematic cross-sectional view illustrating a display device 400 according to other embodiment of the present disclosure.

The display device 400 according to other embodiment of the present disclosure includes a substrate 110, a thin film transistor 200, and an organic light emitting diode 170 connected with the thin film transistor 200.

The display device 400 including the thin film transistor 200 of FIG. 2 is shown in FIG. 5. However, other embodiment of the present disclosure is not limited to this instance, and the thin film transistors 100 and 300 shown in FIGS. 1 and 3 can be applied to the display device 400 of FIG. 5.

Referring to FIG. 5, the display device 400 includes the substrate 110, the thin film transistor 200 disposed on the substrate 110, and a first electrode 271 connected with the thin film transistor 200. Also, the display device 400 includes an organic layer 272 disposed on the first electrode 271 and a second electrode 273 disposed on the organic layer 272.

In detail, the substrate 110 can be made of a glass or a plastic. A buffer layer 121 can be disposed on the substrate 110. Also, a light-shielding layer 180 can be disposed between the substrate 110 and the buffer layer 121.

The thin film transistor 200 can be disposed on the buffer layer 121. The thin film transistor 200 includes an oxide semiconductor layer 130 on the buffer layer 121, a gate insulating film 120 on the oxide semiconductor layer 130, a gate electrode 140 on the gate insulating film 120, a hydrogen supply layer 125 on the gate insulating film 120, an inter-layer dielectric film 170, a source electrode 150 connected with the oxide semiconductor 130, and a drain electrode 160 spaced apart from the source electrode 150 and connected with the oxide semiconductor layer 130. The oxide semiconductor layer 130 includes a channel portion 131 overlapped with the gate electrode 140 and connecting portions 133a and 133b that are not overlapped with the gate electrode 140.

A passivation layer 191 can be disposed on the thin film transistor 200. The passivation layer 191 protects the thin film transistor 200. The passivation layer 191 can be omitted.

A planarization film 190 can be disposed on the passivation layer 191 and planarizes the upper portion of the substrate 110. The planarization film 190 can be made of, but not limited to, an organic insulating material such as acrylic resin with photosensitivity.

A first electrode 271 can be disposed on the planarization film 190. The first electrode 271 can be connected with the drain electrode 160 of the thin film transistor 200 through a contact hole provided in the planarization film 190 and the passivation layer 191.

A bank layer 250 can be disposed on the first electrode 271 and the planarization film 190 and thus defines a pixel area or a light emitting area. For example, the bank layer 250 can be disposed in a boundary area between a plurality of pixels in a matrix arrangement, whereby the pixel area can be defined.

An organic layer 272 can be disposed on the first electrode 271. The organic layer 272 can be disposed even on the bank layer 250. That is, the organic layer 172 can be connected between adjacent pixels without being separated per pixel.

The organic layer 272 includes an organic light emitting layer. The organic layer 272 can include a single organic light emitting layer, or can include two organic light emitting layers deposited up and down or more than two organic light emitting layers. Light with one of red, green, or blue colors can be emitted from the organic layer 272, and white light can be emitted.

The second electrode 273 can be disposed on the organic layer 272.

An organic light emitting diode 270 can be made by depositing the first electrode 271, the organic layer 272, and the second electrode 273. The organic light emitting diode 270 can serve as a light-amount control layer in the display device 400.

If the organic layer 272 emits white light, in an individual pixel, a color filter can be used to filter the white light emitted from the organic layer 272 per wavelength. The color filter can be disposed on a moving path of light. In an instance of a bottom emission method in which light emitted from the organic layer 272 moves to the substrate 110 at the lower portion, the color filer can be disposed below the organic layer 272, and in an instance of a top emission method in which light emitted from the organic layer 272 moves to the second electrode 273 at the upper portion, the color filer can be disposed above the organic layer 272.

Figure 6:
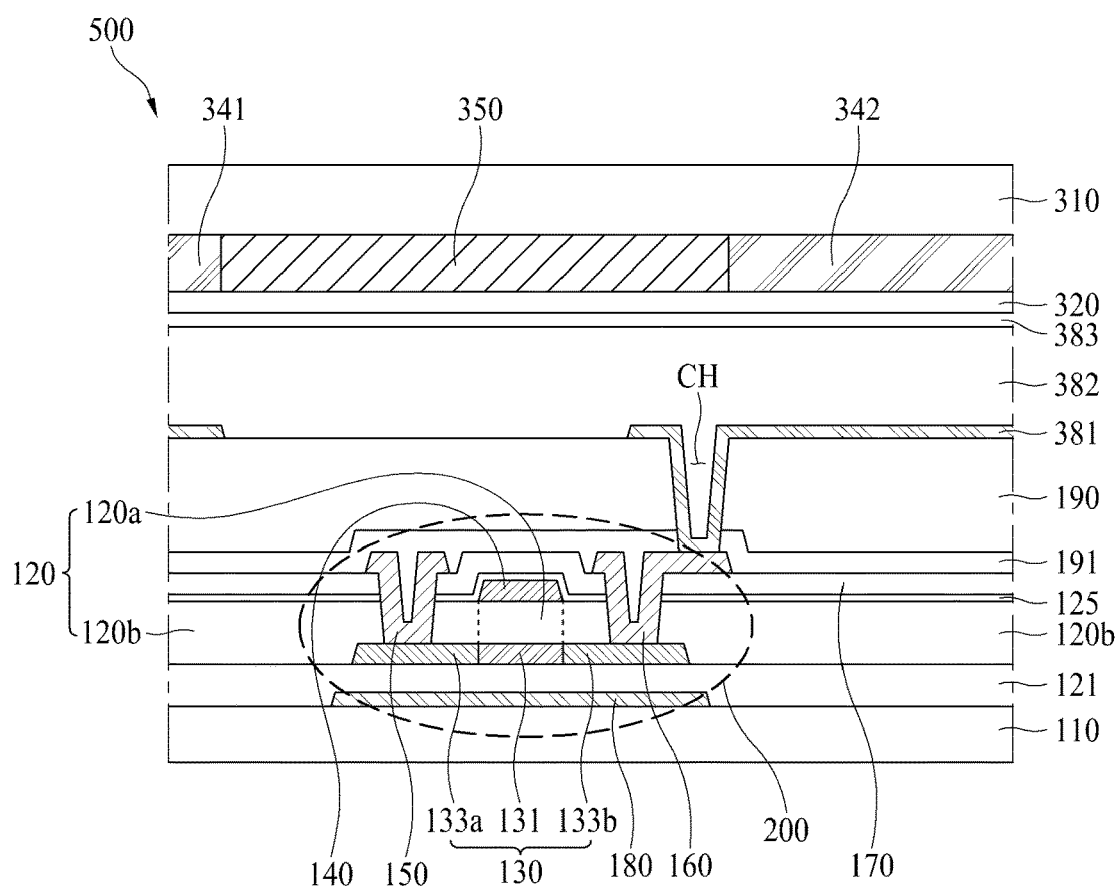
FIG. 6 is a schematic cross-sectional view illustrating a display device according to further still another embodiment of the present disclosure.

FIG. 6 is a schematic cross-sectional view illustrating a display device 500 according to other embodiment of the present disclosure.

Referring to FIG. 6, the display device 500 according to other embodiment of the present disclosure includes a substrate 110, a thin film transistor 200 disposed on the substrate 110, a first electrode 381 connected with the thin film transistor 200. Also, the display device 500 includes a liquid crystal layer 382 on the first electrode 381 and a second electrode 383 on the liquid crystal layer 382. All the components of the display device 500 according to all embodiments of the present disclosure are operatively coupled and configured.

The liquid crystal layer 382 serves as a light-amount control layer. As such, the display device shown in FIG. 6 can be a liquid crystal display device including the liquid crystal layer 382.

In more detail, the display device 500 in FIG. 6 includes the substrate 110, the thin film transistor 200, a planarization film 190, the first electrode 381, the liquid crystal layer 382, the second electrode 383, a barrier layer 320, color filters 341 and 342, a light-shielding portion 350, and a facing substrate 310.

The substrate 110 can be made of a glass or a plastic. A buffer layer 121 can be disposed on the substrate 110. Also, a light-shielding layer 180 can be disposed between the substrate 110 and the buffer layer 121.

Referring to FIG. 6, the thin film transistor 200 can be disposed on the buffer layer 121 on the substrate 110. The thin film transistor 200 includes an oxide semiconductor layer 130 on the buffer layer 121, a gate insulating film 120 on the oxide semiconductor layer 130, a gate electrode 140 on the gate insulating film 120, a hydrogen supply layer 125 on the gate insulating film 120, an inter-layer dielectric film 170, a source electrode 150 connected with the oxide semiconductor 130, and a drain electrode 160 spaced apart from the source electrode 150 and connected with the oxide semiconductor layer 130. The oxide semiconductor layer 130 includes a channel portion 131 overlapped with the gate electrode 140 and connecting portions 133a and 133b that are not overlapped with the gate electrode 140.

A passivation layer 191 can be disposed on the thin film transistor 200. The passivation layer 191 protects the thin film transistor 200. The passivation layer 191 can be omitted.

The planarization film 190 can be disposed on the passivation layer 191 and planarizes the upper portion of the substrate 110.

The first electrode 381 can be disposed on the planarization film 190. The first electrode 381 can be connected with the drain electrode 160 of the thin film transistor 200 through a contact hole CH provided in the planarization film 190 and the passivation layer 191.

The facing substrate 310 can be disposed to face the substrate 110.

The light-shielding portion 350 can be disposed on the facing substrate 310. The light-shielding portion 350 has a plurality of openings. The plurality of openings can be disposed to correspond to the first electrode 381 which can be a pixel electrode. The light-shielding portion 350 shields light on areas except the openings. The light-shielding portion 350 is not necessarily required, and can be omitted.

The color filters 341 and 342 can be disposed on the facing substrate 310 and selectively shields a wavelength of incident light from a backlight unit. In more detail, the color filters 341 and 342 can be disposed on a plurality of openings defined by the light-shielding portion 350. Each of the color filters 341 and 342 can express any one of red, green, and blue colors. Each of the color filters 341 and 342 can express a color other than red, green and blue colors.

A barrier layer 320 can be disposed on the color filters 341 and 342 and the light-shielding portion 350. The barrier layer 320 can be omitted.

The second electrode 383 can be disposed on the barrier layer 320. For example, the second electrode 383 can be located on the entire surface of the facing substrate 310. The second electrode 383 can be made of a transparent conductive material such as ITO or IZO.

The first electrode 381 and the second electrode 383 can be disposed to face each other, and the liquid crystal layer 382 can be disposed between the first electrode 381 and the second electrode 383. The second electrode 383 applies an electric field to the liquid crystal layer 382 together with the first electrode 381.

When surfaces facing between the substrate 110 and the facing substrate 310 are defined as upper surfaces of the corresponding substrate and surfaces located to be opposite to the upper surfaces are defined as lower surfaces of the corresponding substrate, a polarizing plate can be disposed on each of the lower surface of the substrate 110 and the lower surface of the facing substrate 310.

Hereinafter, the present disclosure will be described in more detail with reference to the embodiments, comparison examples, and experimental examples.

Embodiment 1

On the substrate 110 made of a glass, the buffer layer 121 was formed of a silicon oxide. The oxide semiconductor layer 130 with 12 nm in thickness was formed on the buffer layer. The oxide semiconductor layer 130 was formed of IGZO-based oxide semiconductor material with 1:1:1 of In, Ga, and Zn based on atom numbers. The gate insulating film 120 made of a silicon oxide and with 25 nm in thickness was formed on the oxide semiconductor layer 130. The gate insulating film 120 was formed to be deposited on the entire surface of the oxide semiconductor layer 130. Then, the gate electrode 140 made of an alloy of Mo/Ti and with 30 nm in thickness was formed, and the hydrogen supply layer 125 made of a silicon nitride was formed on the gate insulating film 120 and the gate electrode 140. SiH4 gas and NH3 gas were used to form the hydrogen supply layer 125. Then, ultraviolet rays with 168 nm in wavelength were irradiated to the hydrogen supply layer 125 for 45 minutes.

Then, the inter-layer dielectric film 170 was formed, and the source electrode 150 and the drain electrode 160 with 30 nm in thickness were formed using an alloy of Mo/Ti on the inter-layer dielectric film 170, whereby the thin film transistor was manufactured.

Comparison Example 1

A thin film transistor was manufactured in the same manner as the embodiment 1 except that the hydrogen supply layer 125 was not formed. This is a comparison example 1. Referring to the comparison example 1, the hydrogen supply layer 125 was not formed, and ultraviolet rays with 168 nm in wavelength were irradiated to the gate insulating film 120 and the gate electrode 140 for 45 minutes.

Comparison Example 2

A thin film transistor was manufactured in the same manner as the embodiment 1 except that ultraviolet rays were not irradiated to a hydrogen supply layer 125 despite that the hydrogen supply layer 125 was formed. This is a comparison example 2.

Figure 7A:
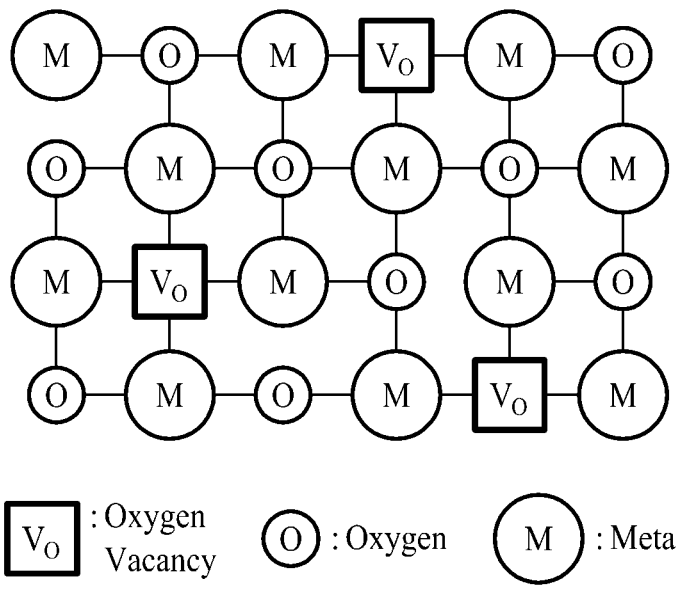
FIG. 7A is a schematic view illustrating a conductorization of an oxide semiconductor layer by ultraviolet irradiation and FIG. 7B is a schematic view illustrating a conductorization of an oxide semiconductor layer by hydrogen doping and ultraviolet irradiation.
Figure 7B:
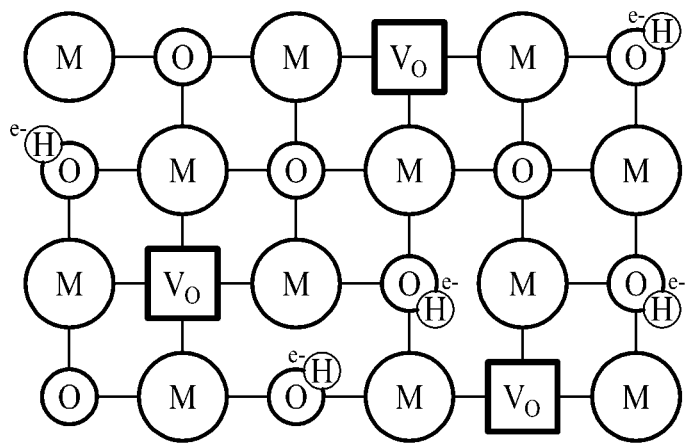

FIG. 7A is a schematic view illustrating a conductorization of an oxide semiconductor layer by ultraviolet irradiation, and FIG. 7B is a schematic view illustrating a conductorization of an oxide semiconductor layer 130 by hydrogen doping and ultraviolet irradiation.

Referring to FIG. 7A, when ultraviolet rays are irradiated to the oxide semiconductor layer 130, oxygen vacancy Vo occurs, which increases carriers, whereby the oxide semiconductor layer can be conductorized (corresponding to comparison example 1). Referring to FIG. 7B, when hydrogen is supplied to the oxide semiconductor layer 130 and ultraviolet rays are irradiated thereto, oxygen vacancy Vo occurs, which increases carriers, and also carriers are generated by hydrogen (corresponding to comparison example 1). In the instance of FIG. 7B, the oxide semiconductor layer 130 can be conductorized more efficiently than the instance of FIG. 7A.

[Experimental Example 1] Evaluation of Conductorization

Figure 8:
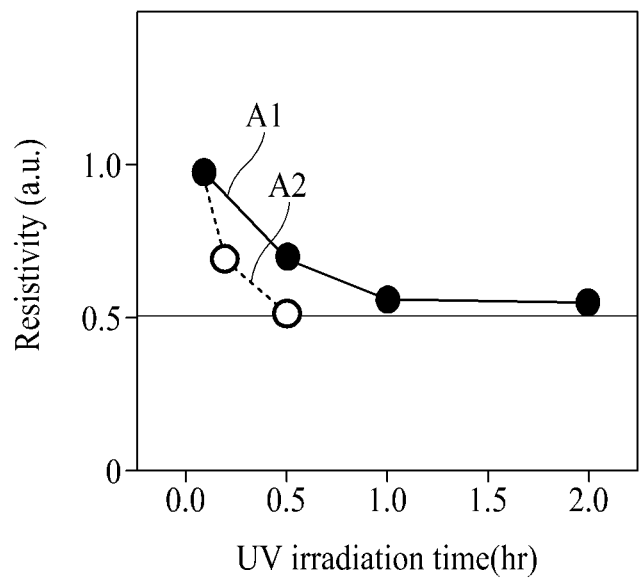
FIG. 8 is a graph illustrating the time of conductorization of an oxide semiconductor layer.

FIG. 8 is a graph illustrating the time of conductorization of an oxide semiconductor layer 130. In the graph of FIG. 8, "A1" represents a resistance change in the first connecting portion 133a of the oxide semiconductor layer 130 according to comparison example 1 in which a hydrogen supply layer 125 is not formed and only ultraviolet rays are irradiated, and "A2" represents a resistance change in the first connecting portion 133a of the oxide semiconductor layer 130 according to the embodiment 1 in which hydrogen is supplied and also ultraviolet rays are irradiated.

Referring to FIG. 8, it is noted that the first connecting portion 133a can be a conductorized in a shorter time in the instance when hydrogen is supplied and also ultraviolet rays are irradiated (A2, embodiment 1) than in the instance when only ultraviolet rays are irradiated (A1, comparison example 1). In this way, when hydrogen can be supplied and also ultraviolet rays are irradiated, the time of the conductorization of the connecting portions 133a and 133b can be reduced and the connecting portions 133a and 133b can stably be conductorized.

[Experimental Example 2] Change in Si—H Bond Amount

Figure 9:
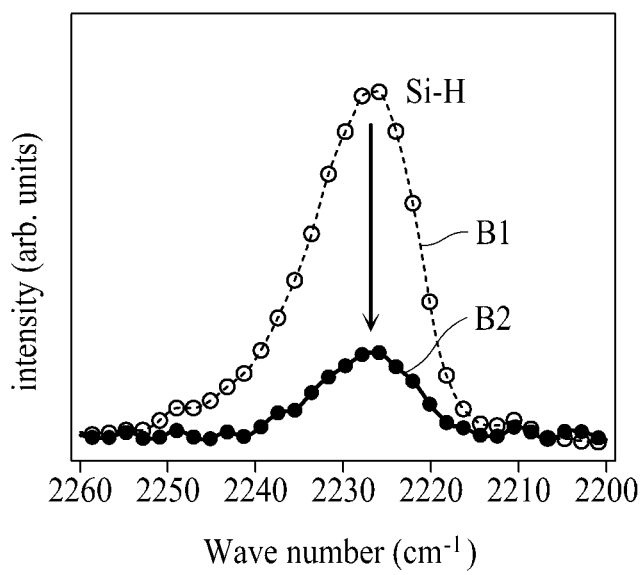
FIG. 9 is a graph illustrating a relative amount of Si—H bond included in a hydrogen supply layer.

In the manufacturing process of the thin film transistor in the embodiment 1, a relative amount of Si—H bond included in the hydrogen supply layer 125 can be measured before and after ultraviolet rays are irradiated. In this instance, an infrared spectrometer (FT-IR Spectrometer) can be used. FIG. 9 is a graph illustrating a relative amount of Si—H bond included in the hydrogen supply layer.

In FIG. 9, "B1" represents a relative amount of Si—H bond before ultraviolet rays are irradiated, and "B2" represents a relative amount of Si—H bond after ultraviolet rays are irradiated. Referring to FIG. 9, it is noted that the amount of Si—H bond in the hydrogen supply layer 125 can be reduced after ultraviolet rays are irradiated. It is noted from the result that Si—H bond existing in the hydrogen supply layer 125 can be broken due to the ultraviolet irradiation and oxygen generated when Si—H bond is broken moves to the connecting portions 133a and 133b of the oxide semiconductor layer 130 through the gate insulating film 120.

[Experimental Example 3]: Measurement of Hydrogen Content

Hydrogen contents contained in the hydrogen supply layer 125, the gate insulating film 120, and the oxide semiconductor layer 130 according to the embodiment 1 were measured using TOF-SIMS (Time of Flight Secondary Ion Mass Spectrometry). For reference, TOF-SIMS can be a device for analyzing atoms or ions constituting a material surface by analyzing secondary ions emitted from the material surface after primary ions having a certain energy enter a solid surface of the material surface.

In more detail, surfaces of the hydrogen supply layer 125, the gate insulating film 120, and the oxide semiconductor layer 130 according to the embodiment 1 were etched while certain energy was being applied to the surfaces, and ions generated when certain energy was applied to the surfaces of the hydrogen supply layer 125, the gate insulating film 120, and the oxide semiconductor layer 130 were analyzed, whereby a hydrogen content contained in each area was measured.

Figure 10A:
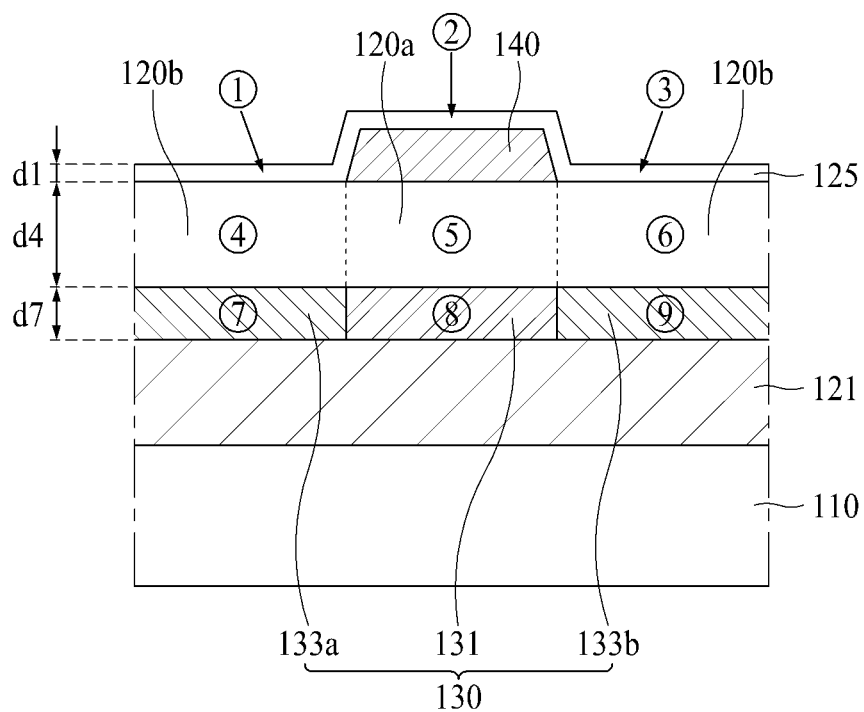
FIG. 10A illustrates each area where a hydrogen content is measured.

FIG. 10A illustrates each area where a hydrogen content is measured. FIGS. 10B to 10E illustrate a relative hydrogen concentration in each area. Specifically, a hydrogen concentration before ultraviolet (UV) irradiation and a hydrogen concentration after ultraviolet irradiation are shown in FIGS. 10B to 10E. In the following discussion of FIGS. 10A through 10E, areas "1", "2", "3", "4", "5", "6", "7", "8" and "9" respectively refer to the circled numbers shown in FIGS. 10A through 10E, respectively.

Figure 10B:
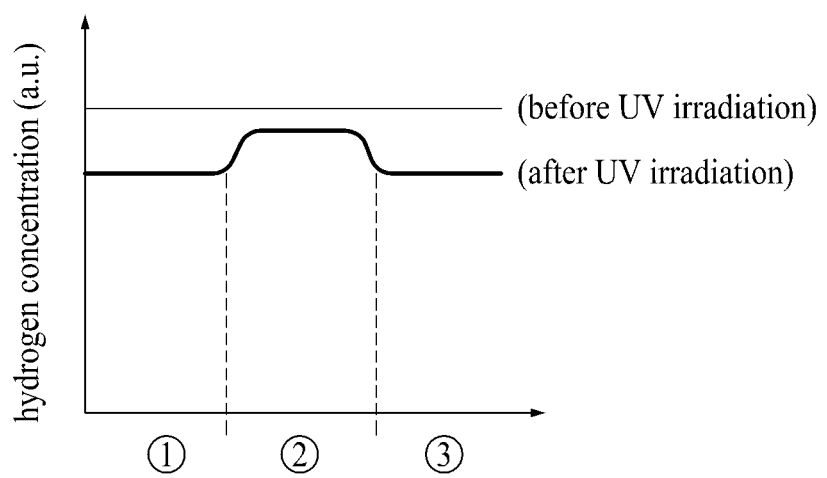
FIG. 10B illustrates a relative hydrogen concentration of each area of a hydrogen supply layer.

FIG. 10B illustrates a relative hydrogen concentration of each area of the hydrogen supply layer 125. In FIG. 10B, the area "1" is an area overlapped with the first connecting portion 133a, the area "2" is an area overlapped with the gate electrode 140 or the channel portion 131, and the area "3" is an area overlapped with the second connecting portion 133b. Referring to FIG. 10B, the gate electrode 140 serves as a mask for blocking a mobility of hydrogen, whereby there is not much of hydrogen mobility to a lower portion in the area "2" overlapped with the gate electrode 140. Therefore, the area "2" in the hydrogen supply layer 125 contains hydrogen with a higher concentration than the area "1" and the area "3".

Figure 10C:
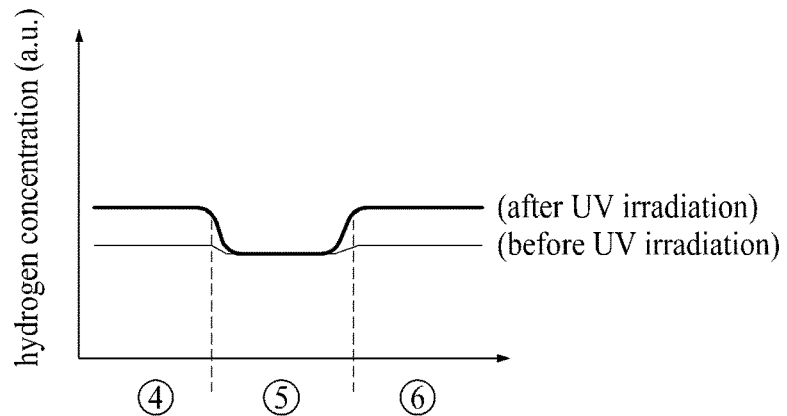
FIG. 10C illustrates a relative hydrogen concentration of each area of a gate insulating film.

FIG. 10C illustrates a relative hydrogen concentration of each area of the gate insulating film 120. In FIG. 10C, the area "4" is an area overlapped with the first connecting portion 133a, the area "5" is an area overlapped with the gate electrode 140 or the channel portion 131, and the area "6" is an area overlapped with the second connecting portion 133b. The area "4" and the area "6" in FIG. 10C correspond to the second area 120b of the gate insulating film 120, and the area "5" corresponds to the first area 120a of the gate insulating film 120. Referring to FIG. 10C, it is noted that a hydrogen concentration of the second area 120b of the gate insulating film 120 can be higher than that of the first area 120a.

Figure 10D:
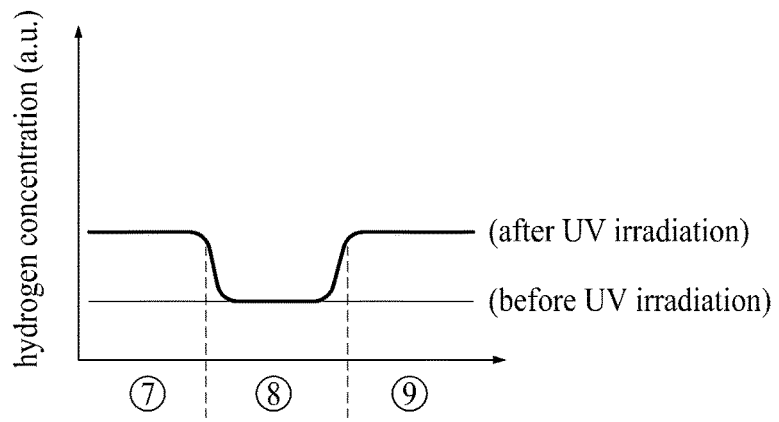
FIG. 10D illustrates a relative hydrogen concentration of each area of an oxide semiconductor layer.

FIG. 10D illustrates a relative hydrogen concentration of each area of the oxide semiconductor layer 120. In FIG. 10D, the area "7" is the first connecting portion 133a, the area "8" is the channel portion 131, and the area "9" is the second connecting portion 133b. Referring to FIG. 10D, it is noted that a hydrogen concentration of the connecting portions 133a and 133b can be higher than that of the channel portion 131.

Figure 10E:
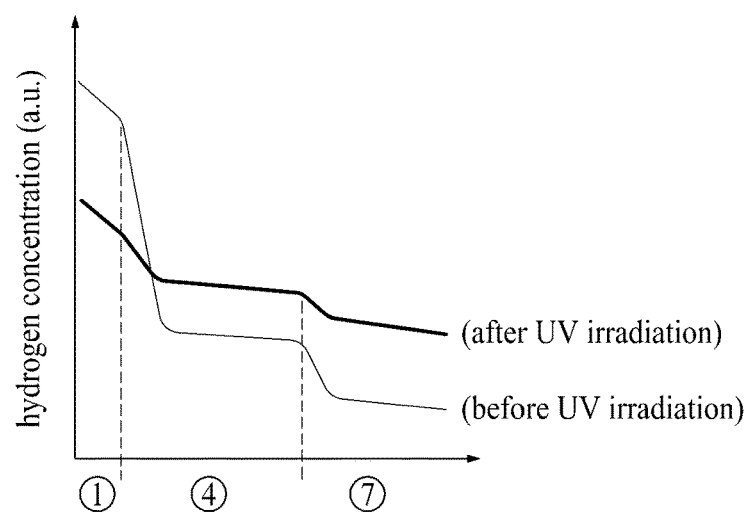
FIG. 10E illustrates a relative hydrogen concentration according to a depth.

FIG. 10E illustrates a relative hydrogen concentration according to a depth. Specifically, FIG. 10E is a graph illustrating that a hydrogen content in the area overlapped with the first connecting portion 133a can be measured, wherein a horizontal axis represents a depth from the surface of the hydrogen supply layer 125. In FIG. 10E, the area "1" corresponds to a thickness range d1 of the hydrogen supply layer 125, the area "4" corresponds to a thickness range d4 of the second area 120b of the gate insulating film 120, and the area "7" corresponds to a thickness range d7 of the first connecting portion 133a. A vertical axis represents the number of hydrogen atoms which are detected and corresponds to a hydrogen concentration. Referring to FIG. 10E, it is noted that the second area 120b of the gate insulating film 120 and the connecting portions 133a and 133b of the oxide semiconductor layer 130 have a gradient of a hydrogen concentration along a thickness direction. In this instance, the hydrogen concentration increases in the direction of the hydrogen supply layer 125 from the substrate 110. In FIGS. 10B through 10E, (a.u.) refers to an arbitrary unit, and simply shows magnitude or a relative amount of the hydrogen concentration.

[Experimental Example 4] Measurement of Carrier Concentration

An electron concentration and a hydrogen concentration of the first connecting portion were measured using the thin film transistor according to the embodiment 1 and the comparison example 1. As a result, it is noted that the first connecting portion of the thin film transistor according to the embodiment 1 has an electron concentration of $6 \times 10^{19}/cm^3$ and a hydrogen concentration with about 6 atoms %, whereas the first connecting portion of the thin film transistor according to comparison example 1 has an electron concentration of $2\times10^{19}/cm^3$ and a hydrogen concentration with about 2 atoms %. It is noted from this result that the first connecting portion 133a of the thin film transistor according to the embodiment 1 has conductivity more excellent than that of the first connecting portion 133a of the thin film transistor according to the comparison example 1.

[Experimental Example 5] Measurement of Threshold Voltage Vth

Figure 11A:
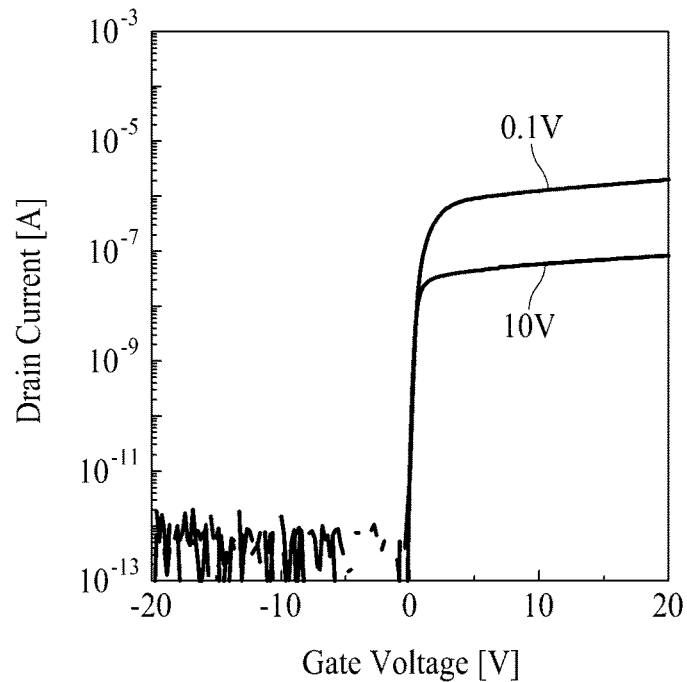
FIGS. 11A and 11B are measurement graphs of a threshold voltage Vth.
Figure 11B:
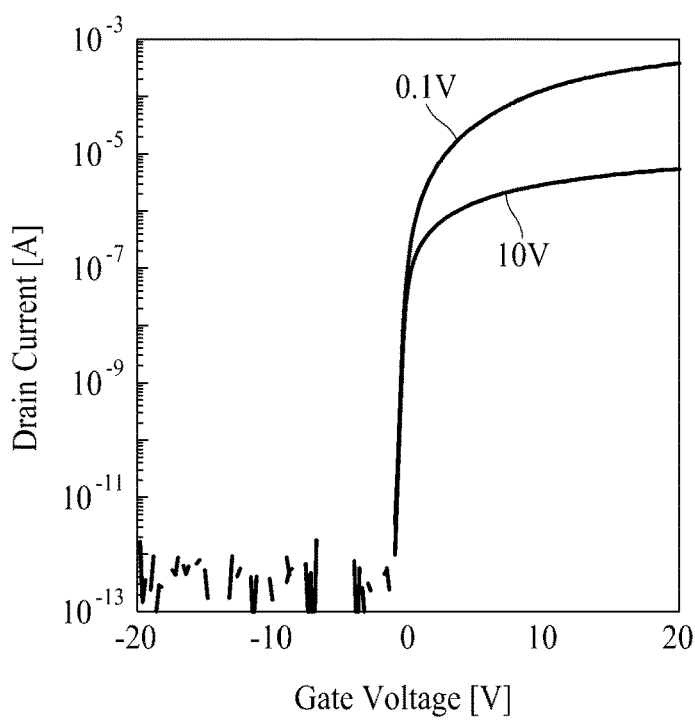

The threshold voltage Vth of the thin film transistor in the embodiment 1 and the comparison example 2 was measured. In order to measure the threshold voltage Vth, a drain current was measured by applying a gate voltage with a range between −20V and +20V. Voltages of 0.1V and 10V were applied between the source electrode 150 and the drain electrode 160. In FIGS. 11A and 11B, 10V represents the drain current when the voltage of 10V is applied between the source electrode 150 and the drain electrode 160 and 0.1V represents the drain current when the voltage of 0.1V is applied between the source electrode 150 and the drain electrode 160.

FIGS. 11A and 11B are measurement graphs of a threshold voltage Vth. Specifically, FIGS. 11A and 11B are results of measuring the threshold voltage Vth of the thin film transistor in the comparison example 2 and the embodiment 1.

Referring to FIG. 11A, it is noted that the thin film transistor in the comparison example 2 has a threshold voltage of 0.90V, s-factor of 0.16, mobility of 0.33 cm²/Vs, and a relatively low drain current.

Referring to FIG. 11b, it is noted that the thin film transistor in the embodiment 1 has a threshold voltage Vth of −0.25V, s-factor of 0.16, mobility of 42.17 cm²/Vs, and a relatively high drain current.

It is noted that the connecting portions 133a and 133b are excellently conductorized in the thin film transistor according to the embodiment 1 and thus the thin film transistor according to the embodiment 1 has a higher mobility than that of the thin film transistor in the comparison example 2, whereby the thin film transistor according to the embodiment 1 has a higher drain current.

As described above, the thin film transistor according to one embodiment of the present disclosure has excellent capacity. Also, the display device according to one embodiment of the present disclosure, which includes the thin film transistor, has an excellent display property.

As described above, according to the present disclosure, the following effects and advantages can be obtained.

According to one embodiment of the present disclosure, the connecting portions are conductorized quickly and stably by the hydrogen supply layer disposed on the gate insulating film and ultraviolet irradiation. Therefore, according to one embodiment, the time of the conductorization of the connecting portions can be shortened and the connecting portions can have a high carrier concentration and excellent electric capacity. Also, since the gate insulating film covers the entire surface of the oxide semiconductor layer, the oxide semiconductor layer can be prevented from being damaged, and insulation defects between the gate electrode and oxide semiconductor layer are avoided.

The display device according to one embodiment of the present disclosure, which includes the thin film transistor, can have excellent reliability and excellent display property.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to [insert list], are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A thin film transistor comprising:
an oxide semiconductor layer on a substrate;
a gate insulating film on the oxide semiconductor layer;
a gate electrode on the gate insulating film;
a hydrogen supply layer on the gate insulating film;
a source electrode connected with the oxide semiconductor layer; and
a drain electrode spaced apart from the source electrode and connected with the oxide semiconductor layer,
wherein the oxide semiconductor layer includes a channel portion overlapped with the gate electrode and a connecting portion not overlapped with the gate electrode, a hydrogen concentration of the connecting portion is higher than that of the channel portion, and the gate insulating film includes a first area overlapped with the gate electrode and a second area not overlapped with the gate electrode, and a hydrogen concentration of the second area is higher that of the first area
wherein, for the hydrogen supply layer, a hydrogen concentration of the area overlapped with the gate electrode is higher than that of the area not overlapped with the gate electrode.

2. The thin film transistor according to claim 1, wherein the connecting portion has a gradient of a hydrogen concentration along a direction of the hydrogen supply layer from the substrate.

3. The thin film transistor according to claim 1, wherein the connecting portion has a hydrogen concentration of approximately 3 atom % to 6 approximately atom %.

4. The thin film transistor according to claim 1, wherein the gate insulating film is disposed on an entire surface of the oxide semiconductor layer in an opposite direction of the substrate.

5. The thin film transistor according to claim 1, wherein the second area of the gate insulating film has a gradient of a hydrogen concentration along a thickness direction.

6. The thin film transistor according to claim 1, wherein a hydrogen concentration of the second area increases in a direction toward the hydrogen supply layer from the substrate.

7. The thin film transistor according to claim 1, wherein the hydrogen supply layer is extended to an upper portion of the gate electrode.

8. The thin film transistor according to claim 1, wherein the hydrogen supply layer has a thickness of approximately 2 nm to approximately 10 nm.

9. The thin film transistor according to claim 1, wherein the hydrogen supply layer is formed of a silicon nitride.

10. The thin film transistor according to claim 1, wherein a conductivity of the connecting portion is higher than that of the channel portion based on the connecting portion having the higher hydrogen concentration than that of the channel portion.

\* \* \* \* \*